(12) United States Patent
Vaartstra et al.

(10) Patent No.: US 9,240,427 B2
(45) Date of Patent: Jan. 19, 2016

(54) CFA RESIST SILYLATION FOR LIMITING COLOR INTERACTIONS AND IMPROVING CROSSTALK

(75) Inventors: Brian Vaartstra, Nampa, ID (US); Richard Holscher, Boise, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1141 days.

(21) Appl. No.: 13/223,594

(22) Filed: Sep. 1, 2011

(65) Prior Publication Data

US 2012/0273905 A1 Nov. 1, 2012

Related U.S. Application Data

(60) Provisional application No. 61/480,034, filed on Apr. 28, 2011.

(51) Int. Cl.
*H01L 31/18* (2006.01)
*H01L 27/146* (2006.01)
*H04N 9/04* (2006.01)

(52) U.S. Cl.
CPC .......... *H01L 27/14621* (2013.01); *H04N 9/045* (2013.01)

(58) Field of Classification Search
CPC ...................... H01L 27/14621; H01L 31/0232
USPC ..................................................... 257/40, 432
See application file for complete search history.

(56) References Cited

U.S. PATENT DOCUMENTS

2006/0266921 A1* 11/2006 Kang et al. .................. 250/208.1
2010/0160474 A1* 6/2010 Lee et al. ......................... 522/42
2012/0012959 A1* 1/2012 Chen ............................. 257/432

* cited by examiner

*Primary Examiner* — Tran Tran

(57) ABSTRACT

An electronic imager includes a pixel sensor array, a plurality elements of a color filter array containing pigments forming multiple color filter patterns on the pixel sensor array and a silylating agent formed between at least first and second elements of the multiple color filter patterns. A method for forming a color filter array on a pixel sensor array of an electronic imager includes forming a pixel sensor array on a substrate, forming a first color filter pattern on the pixel sensor array, depositing a silylating agent on the first color filter pattern, disposing elements of a second color filter pattern on the silylating agent between respective elements of the first color filter pattern and disposing elements of a third color filter pattern on the silylating agent between respective elements of the first color filter pattern.

13 Claims, 17 Drawing Sheets

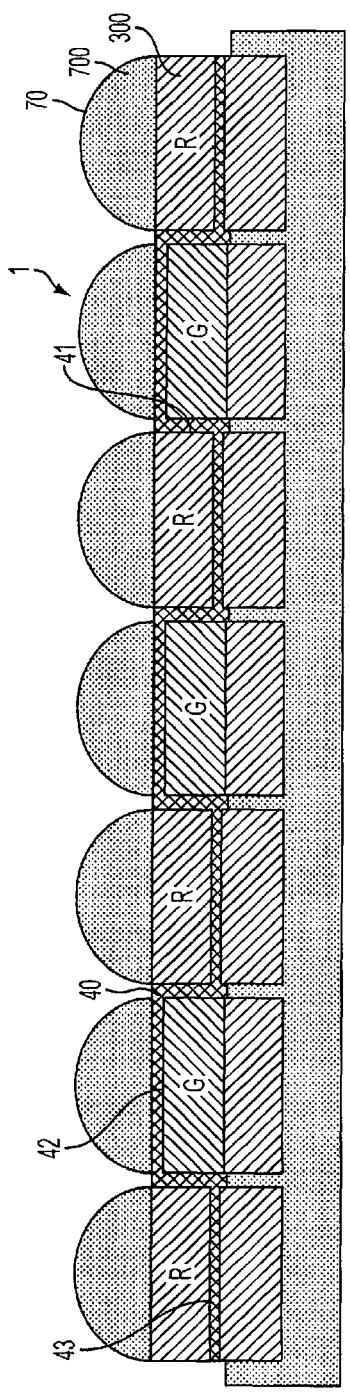
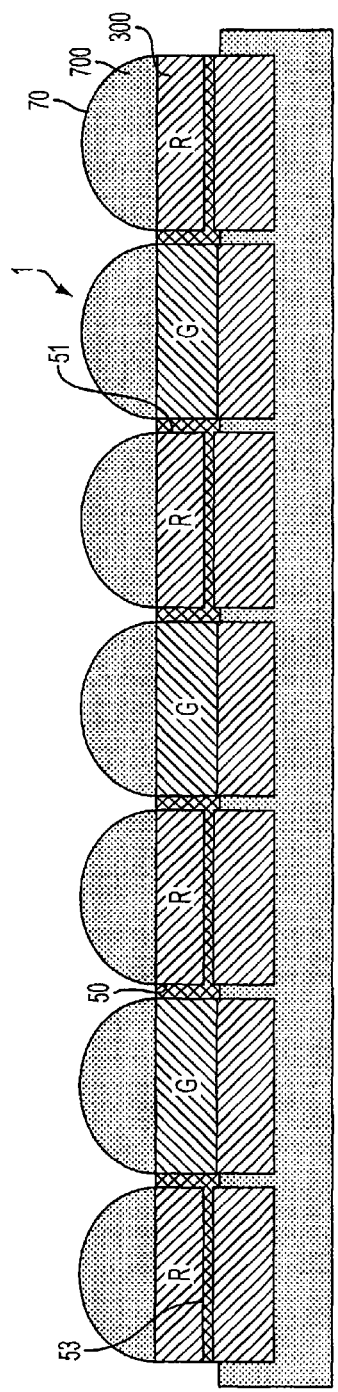

CFA RESIST SILYLATION FOR LIMITING COLOR INTERACTIONS AND IMPROVING CROSSTALK

CROSS REFERENCE TO RELATED APPLICATIONS

This application claims priority of U.S. Provisional Patent Application Ser. No. 61/480,034, filed Apr. 28, 2011.

FIELD OF THE INVENTION

The invention described herein relates generally to imaging devices and, more specifically, to novel color filter arrays for use in electronic imagers to limit color interactions, improve crosstalk and limit optical loss.

BACKGROUND OF THE INVENTION

Most electronic imagers adopt a design for capturing full color images with a single image sensor overlaid with a color filter array (CFA). A single image sensor can be a pixel array wherein each pixel includes a photo sensor which generates photoelectrons from photons. Additional circuitry next to each photo sensor converts the photoelectrons to a voltage. Extra circuitry on the pixel array may be included to convert the voltage to digital data. A color filter array on a pixel array enables each pixel or photo sensor to capture the intensity of light across a color spectrum. A microlens array is generally placed over the color filter array to focus the received light onto the photo sensors.

Color filter arrays and microlenses used in electronic imagers and sensors are often made of photoresist material. Different chemicals may be used to give the material desired property variations to be suitable for use as color filters.

Several factors related to a color filter array and a microlens influence the imaging quality in an electronic imager. First, certain mechanical and chemical properties of the photoresist material, such as hardness, chemical resistance, durability, resistance to humidity and other atmospheric stresses, determine the selection of a photoresist material. Chemical and physical changes may occur in the exposed areas of the photoresist layer. For example, chemical bonds may be formed or destroyed between some of adjacent photoresist color filters causing defects at the surface of the color filter array.

Next, the design of a pixel array coupled with a color filter array inevitably also suffers, due to physical characteristics of the optical and semiconductor components, from the problem of crosstalk between different pixel elements. Crosstalk, a phenomenon where photon or electron leakages cause an interaction between neighboring pixels, increases as the distances between pixels decreases. The nature of the crosstalk in image sensors has various origins: electron diffusion in the photo screen, insufficient optical separation of pixels or even electrical crosstalk in the readout sensor. The crosstalk in image sensors can desaturate colors and blur image details. Thus, when crosstalk occurs, resolution decreases in the image sensor, causing distortion in images produced by the sensor.

BRIEF DESCRIPTION OF THE DRAWINGS

Exemplary embodiments will be explained in greater detail below with reference to Figures, in which:

FIGS. 8A, 8B and 8C are sectional views of a microlens array disposed on different embodiments of the color filter array in the electronic imager according to the invention.

DETAILED DESCRIPTION OF THE INVENTION

Exemplary embodiments of the present invention are described more fully hereinafter with reference to the accompanying drawings. It is to be understood that although the following description mainly provides color filter arrays, as well as microlenses, used in electronic imagers, having a chemical modification using a silylating agent as examples, many alterations and changes can be made by those skilled in the art, without deviating from the scope of the invention. This description is not to be taken in a limiting sense, but is made merely for the purpose of illustrating the general principles of the invention.

Hereinafter, embodiments of the invention will be described with reference to the drawings.

In interest of compact size, low power consumption, and faster readout with electronic imagers, pixel sizes have become smaller and smaller and new photoresist CFA's with higher resolution are being employed. Among the new photoresists, some photoresists react with each other producing crystalline byproducts that cause defects at the surface of the CFA and at the interfaces of the individual pixels, in addition to the crosstalk occurring between pixels.

Furthermore, the photoresist materials are inherently soft (on a hardness scale) and also of refractive index, e.g., 1.63. It is desirable to modify the CFAs, particularly in their outer layers, to make a harder and lower refraction index CFAs to limit optical losses.

Figure 1:
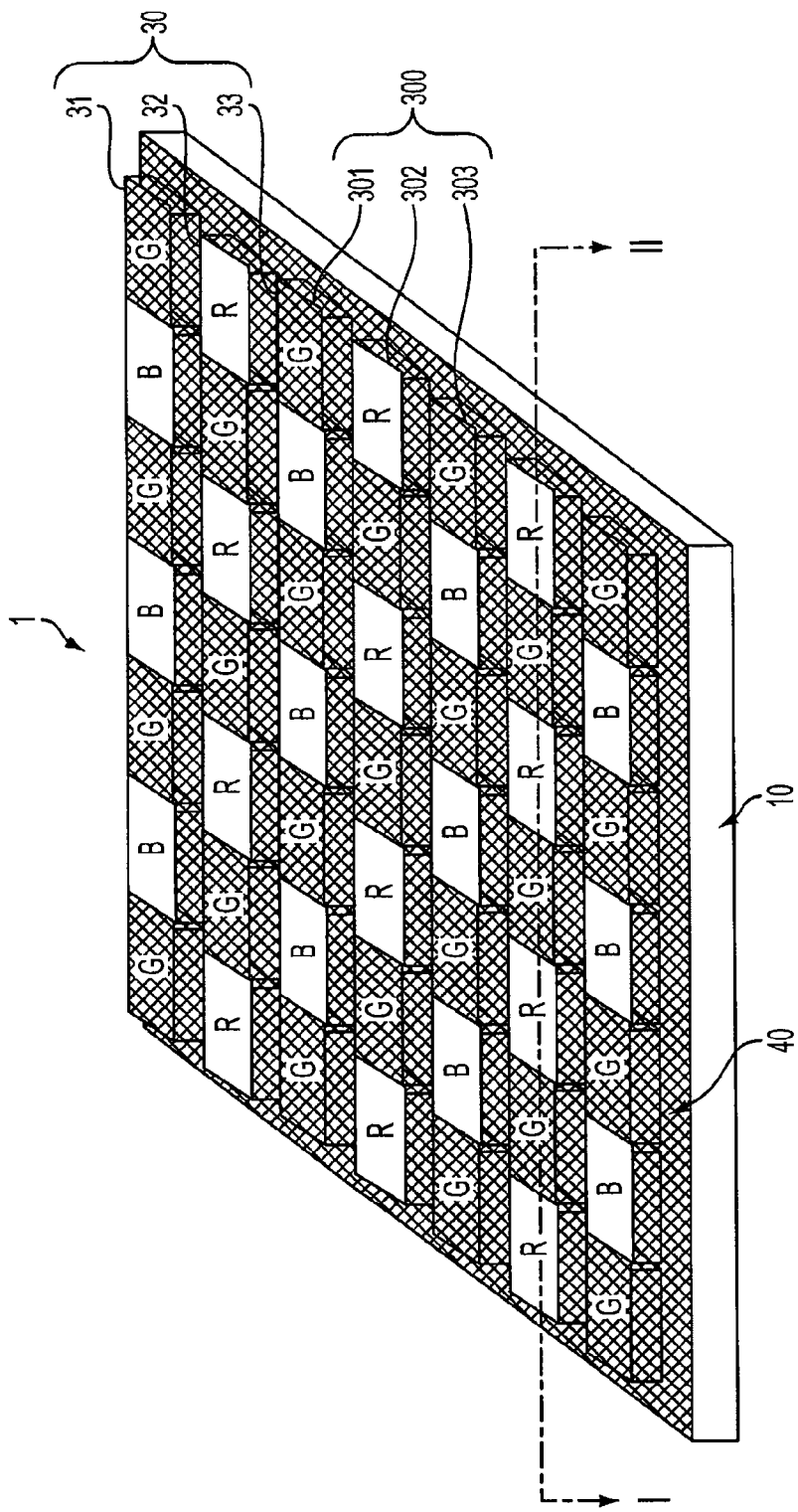
FIG. 1 is a perspective view of a color filter array (CFA) in an electronic imager according to an embodiment of the invention.
Figure 2:
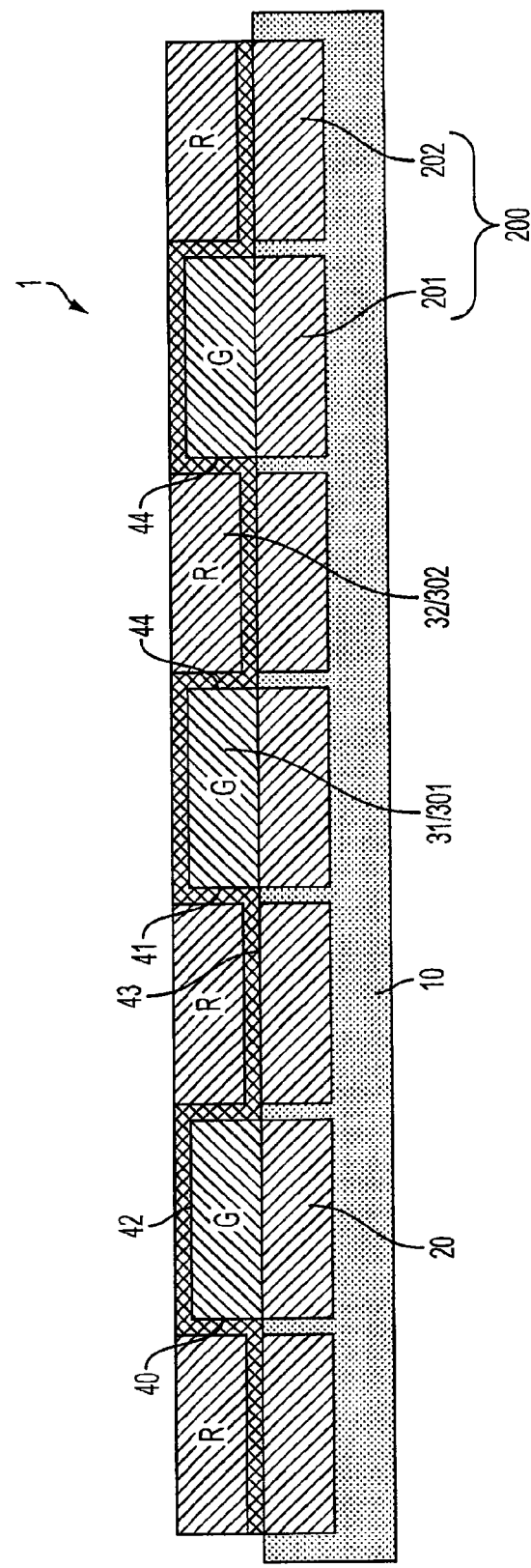
FIG. 2 is a cross-sectional view of the color filter array in the electronic imager according to the invention taken along the line I-II in FIG. 1.
Figure 3:
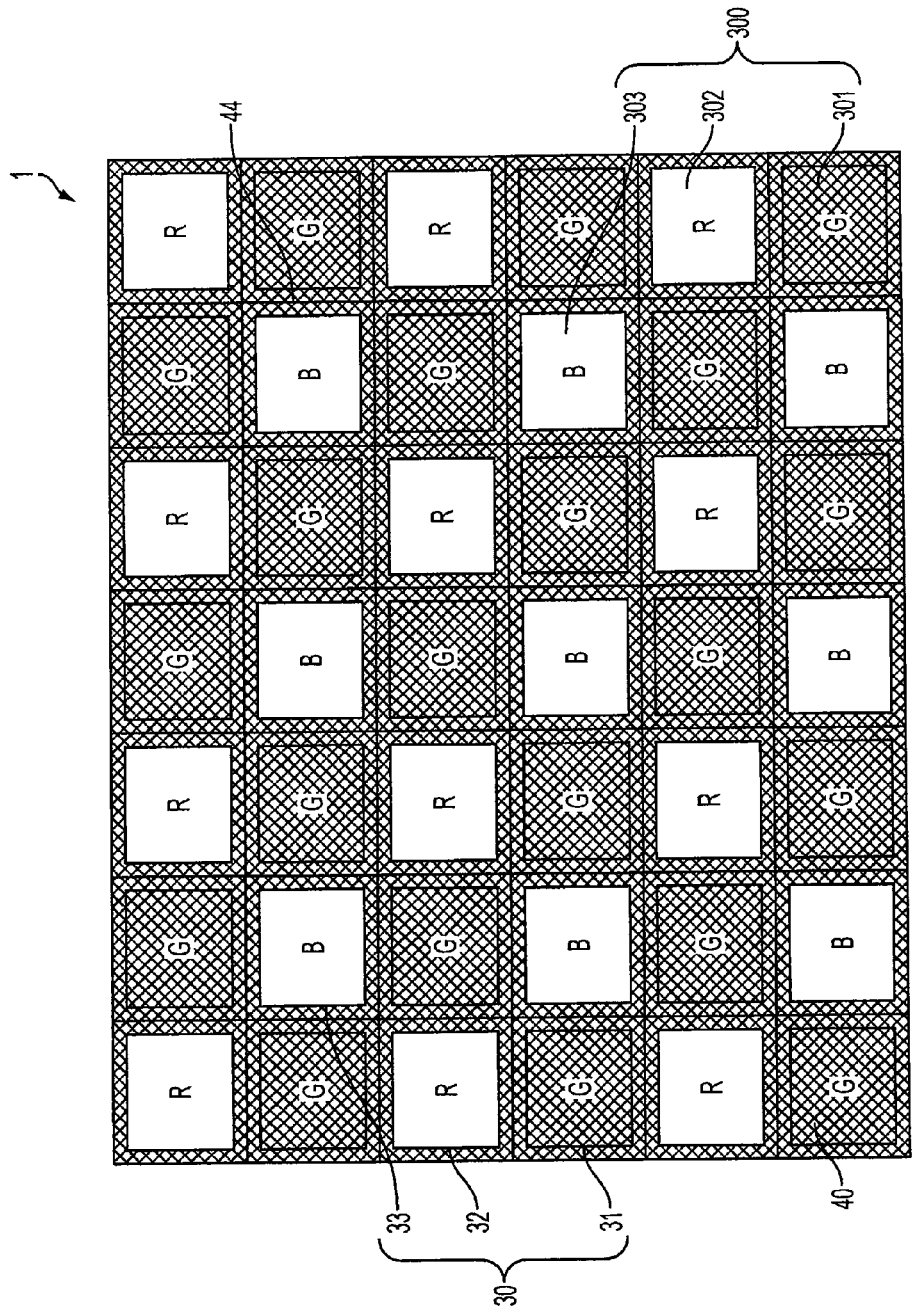
FIG. 3 is a top view of the color filter array in the electronic imager according to the invention.

An example of a color filter array (CFA) 1 in an electronic imager according to the present invention, as illustrated in FIG. 1 to FIG. 3, is provided with a substrate 10, a pixel sensor array 20 (shown in FIGS. 2 and 10A), a plurality elements 300 of the color filter array 1 and a silylating agent 40. The pixel sensor array 20 is formed on the substrate 10. The plurality elements 300 of the color filter array 1 containing respective pigments form multiple color filter patterns 30 on the pixel sensor array 20. The multiple color filter patterns 30 include a first color pattern 31, a second color pattern 32 and a third color pattern 33. In the embodiment shown in FIG. 1 to FIG. 3, the silylating agent 40 is formed between the first color filter pattern 31 and the second/third color patterns 32, 33 of the multiple color patterns 30. Although FIG. 1 to FIG. 3 illustrate the silylating agent 40 being formed between the first color filter pattern 31 and the second/third color patterns 32, 33, there is no limitation for the silylating agent 40 to be formed on any one of the multiple color patterns. In addition, the silylating agent 40 can also be formed on each individual element 300 of the color filter array 1.

The multiple different color filter patterns 30 may be formed on the color filter array 1 including employing different color filters and arranging these color filters into different patterns. In an example embodiment of the present invention, a Bayer pattern of RGBG is selected. Alternatively, color filter arrays having non-Bayer patterns are also applicable. Those non-Bayer patterns include alternative color filter array to the Bayer pattern, and/or non-conventional patterns, colors and sequences for the color deposition. Examples of such non-Bayer patters include RGBE pattern (red, green, blue, emerald), CYGM pattern (cyan, yellow, green, magenta), CYYM filter (one cyan, two yellow, and one magenta), RGBW pattern (red, green, blue, white), CMYW pattern (cyan, magenta, yellow, and white), RGBW Bayer pattern (traditional RGBW similar to Bayer and RGBE patterns), and any other existing and prospective color filter patterns. In the Bayer pattern of RGBG, the multiple color filter patterns 30 include the first color pattern 31 having elements 301 that contain a green pigment, the second color pattern 32 having elements 302 that contain a red pigment and the third color pattern 33 having elements 303 that contain a blue pigment. Herein, the plurality elements 300 of the color filter array 1 includes the elements 301 that contain the green pigment, the elements 302 that contain the red pigment and the elements 303 that contains the blue pigment.

As shown in FIG. 2, the pixel array 20 has pixel elements 200. The example pixel elements 200 include pixel elements 201 and pixel elements 202. The first color pattern 31 is formed on the pixel elements 201. The second color pattern 31 and the third color pattern 32 are formed on the pixel elements 202. Although the pixel elements 200 is illustrated as cubical structure, any other shapes and sizes may be applied.

In the embodiment shown in FIG. 2, the silylating agent 40 is formed on the first color pattern 31 containing the green pigment and also formed on the pixel elements 202 between respective elements 301 of the first color pattern 31. The silylating agent 40 includes a side portion 41 formed on vertical sides of the elements 301 of the first color pattern 31, a top portion 42 formed on the top side of the elements 301 of the first color pattern 31 and a bottom portion 43 formed on the top side of the pixel elements 202 between the respective elements 301 of the first color pattern 31. Each individual element 302 of the second color pattern 32 and each individual element 303 of the third color pattern 33 (not shown in FIG. 2) are disposed on the top of a respective individual bottom portion 43 with respect to their corresponding coordinations in the Bayer pattern of RGBG and are surrounded by the side portions 41 of the silylating agent 40. The side portions 41 form a boundary layer 44 between each individual element 300 of the color filter array 1, which prevents the elements 301, 302 and 303 of the color filter array 1 from reacting with each other.

As described above, among the new photoresist materials used to form CFA, some elements 301, 302 and 303 of the color filter array 1 may react with each other producing crystalline byproducts that may cause defects at the surface of the color filter array 1, and at the interfaces of the individual pixel elements 200. The chemical silylation modification with the silylating agent 40 on the color filter array 1 prevents each elements 301, 302 and 303 of the color filter array 1 from reacting with the surrounded elements, so as to limit the photoresist interaction.

A silylating agent is a silane that substitutes an active hydrogen in an organic molecule including polymers and resins with an organosilicon group to form a siloxane. The active hydrogen is usually hydroxyl group, amino group, carboxyl group, or amide group and the silane is usually a compound that contains at least one silicon atom. One of the purposes of substitution is to protect reactive group during chemical reaction. In a variety of fields, such as, coatings and electronics, silanes are used as cross linking agents to form siloxanes to improve chemical resistances. The cross-linking agent is a compound that has the capability to chemically connect other molecules in order to create a network of molecules linked together.

Siloxanes are compounds composed of units of the form $R_2SiO$, where R is a hydrogen atom or a hydrocarbon group, with branched or unbranched backbones consisting of alternating silicon and oxygen atoms —Si—O—Si—O—, with side chains R attached to the silicon atoms. The siloxanes have many properties including chemical resistance, tunable refractive index, tunable mechanical properties, excellent photo-stability and good thermal stability. Siloxanes polymers and resins can be viewed as organic-inorganic hybrids that combine many desirable properties of conventional organic and inorganic components. Many of the optical, electrical, and mechanical properties of siloxane materials can be efficiently tuned through a combination of organic groups and material structures. The refractive index of a siloxane polymer is composition dependent and generally ranges from 1.4 to 1.54. Introduction of composition modification can further expand, the refractive index range to between 1.15 and 1.63. The siloxanes are generally prepared by hydrolysis and condensation of a chloro- or alkoxy silanes.

The silylating agent 40 in the present invention used to create the boundary layers 44 on the color filter array 1 is a silane cross-linking agent containing at least one silicon atom. In an example embodiment of the present invention, 1,2-Bis(trichlorosilyl)ethane, $Cl_3SiCH_2CH_2SiCl_3$, is used as the silylating agent 40. $Cl_3SiCH_2CH_2SiCl_3$ used herein functions as a cross linker having a linking ability to chemically bond the photoresist material together, i.e. $Cl_3SiCH_2CH_2SiCl_3$ reacts with the —OH groups of the photoresist resins causing a cross-linking of the photoresist material to form a siloxane on the outside of the color filters that improves the chemical resistance between adjacent photoresist color filters, and thus, reduces cross talk between the pixel elements that may be caused by an indistinct color filter boundary.

$Cl_3SiCH_2CH_2SiCl_3$ is a colorless, transparent liquid at room temperature and can be deposited on the color filter array 1 by means of vapor deposition or solution deposition.

Furthermore, useful silylating agents in the present invention include the silanes contain silicon atoms, and the mixture thereof. These silylating agents have general formula as follows.

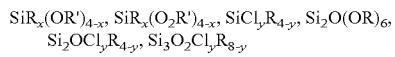
$SiR_x(OR')_{4-x}$, $SiR_x(O_2R')_{4-x}$, $SiCl_yR_{4-y}$, $Si_2O(OR)_6$, $Si_2OCl_yR_{4-y}$, $Si_3O_2Cl_yR_{8-y}$ Herein R and R' stand for independently substituted or unsubstituted hydrocarbyl groups including alkyl groups, aryl groups, halogenated alkyl groups, halogenated aryl groups or alkenyl groups, or organic groups having a (meth) acryloxy, acetoxy, mercapto, amino or cyano group. Examples of the useful silylating agents are (tetraethoxy) silane ($Si(OC_2H_5)_4$), hexachlorodisiloxane ($Si_2OCl_6$), ethyltriethoxysilane ($Si(OC_2H_5)_3(C_2H_5)$), diphenyldichlorosilane ($Si(C_6H_5)_2Cl_2$). The letter "x" and "y" are each independently 0, 1, 2, 3, or 4.

In further detail, the substituted hydrocarbyl groups include one or more functional groups of halides, RCN groups, OR groups, $O_2R$—$NH_zR_{2-z}$, additional $Si(OR)_x$ groups, and acrylate groups, where x=1, 2, 3, or 4 and z=0, 1 or 2.

Furthermore, other useful silylating agents in the present invention include trisilanes containing three silicon atoms. An example of trisilanes is a silazanes, hexamethylcyclotrisilazane $C_6H_{21}N_3Si_3$.

Note that a mixture of silylating agents may be used. For example, a mixture of trimethylchlorosilane and hexamethyldisilazane may be more reactive than either silylating agent alone.

The chemical modification of the multiple color filter patterns 30 employing the silylating agent 40 to form siloxanes between at least one color filter pattern of the multiple color filter patterns 30 provides useful properties of the color filter array 1 in electronic imagers. Those properties include hardness, lower refractive index compared to the photoresist materials, chemical resistance, and good thermal stability.

Figure 4:
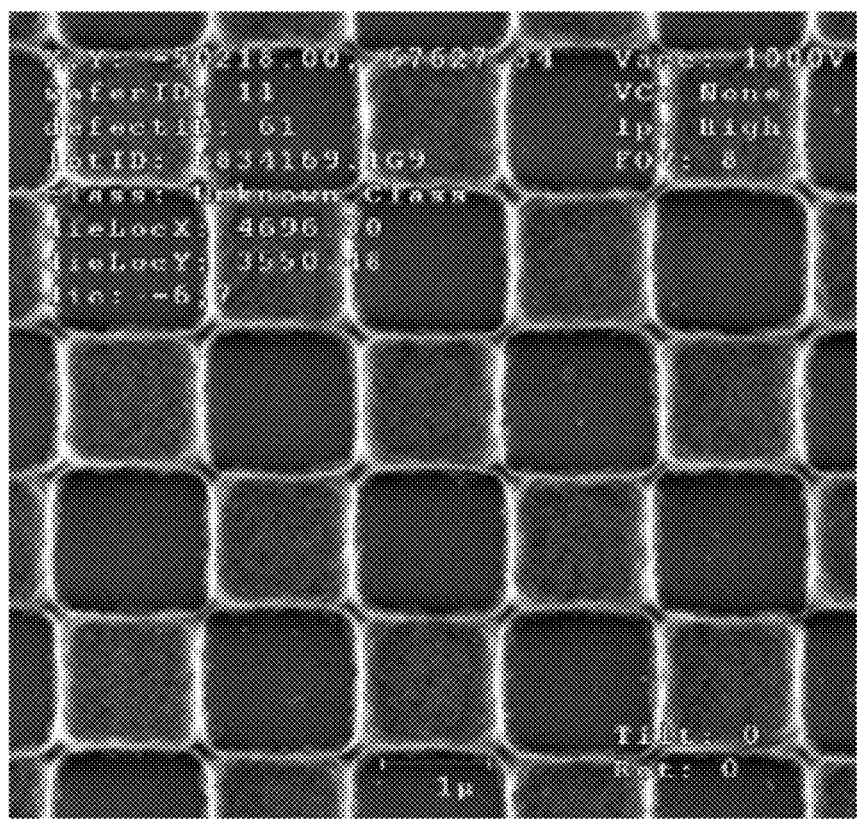
FIG. 4 is a SEM (scanning electron microscope) image of the color filter array (CFA) showing the silylating agent causes a cross linking of the photoresist material according to the invention.

As shown in FIG. 3, the boundary layer 44 is formed between each individual color filter element 301, 302 and 303. FIG. 4 is a scanning electron microscope (SEM) image showing the boundary layer 44 formed with $Cl_3SiCH_2CH_2SiCl_3$ by chemical vapor deposition (CVD).

An additional benefit of the silylating agent formation on the color filter array 1 is that the silylation of the color filter array 1, in particular, forming the bottom portion 43 of the silylating agent 40 on the pixel elements 202, has been shown to improve the optical crosstalk between the pixel elements 200. An 1% reduction in cross-talk reduction is achieved, as shown in the quantum efficiency (QE) measurements shown in FIGS. 5 and 6.

Figure 5:
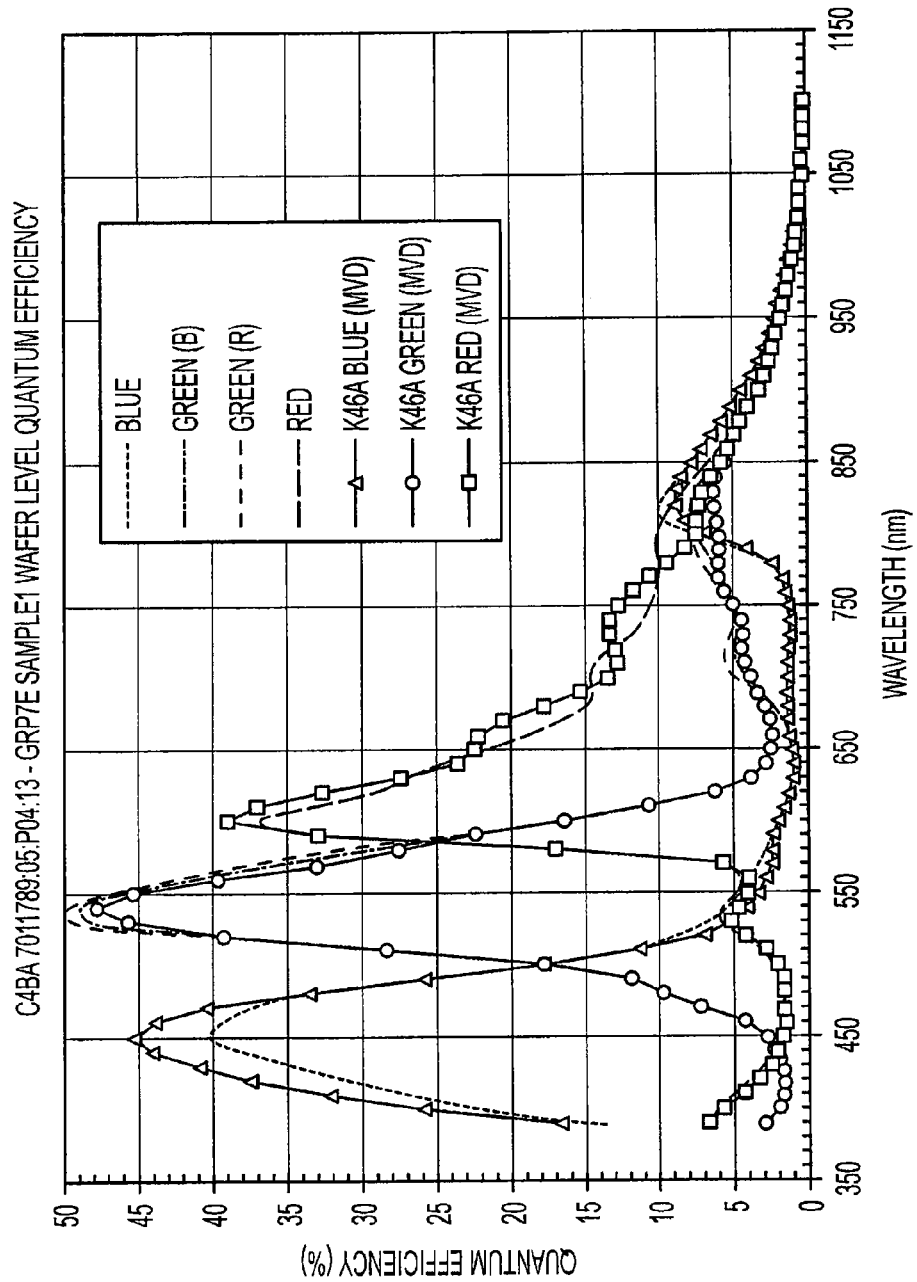
FIG. 5 is a graph of quantum efficiency versus wavelength showing reduced crosstalk between pixels according to an embodiment of the invention.

As shown in FIG. 5, according to an example embodiment of the invention, much higher blue QE, higher red QE toward longer wavelength and slightly lower green QE may be obtained with silylating agent deposited by chemical vapor deposition (CVD). The slightly lower green QE is due to thicker green filters. Thinner green filters may increase the QE peak of the green filters. The overall cross-talk may be reduced from 12% to 10.56%.

Figure 6:
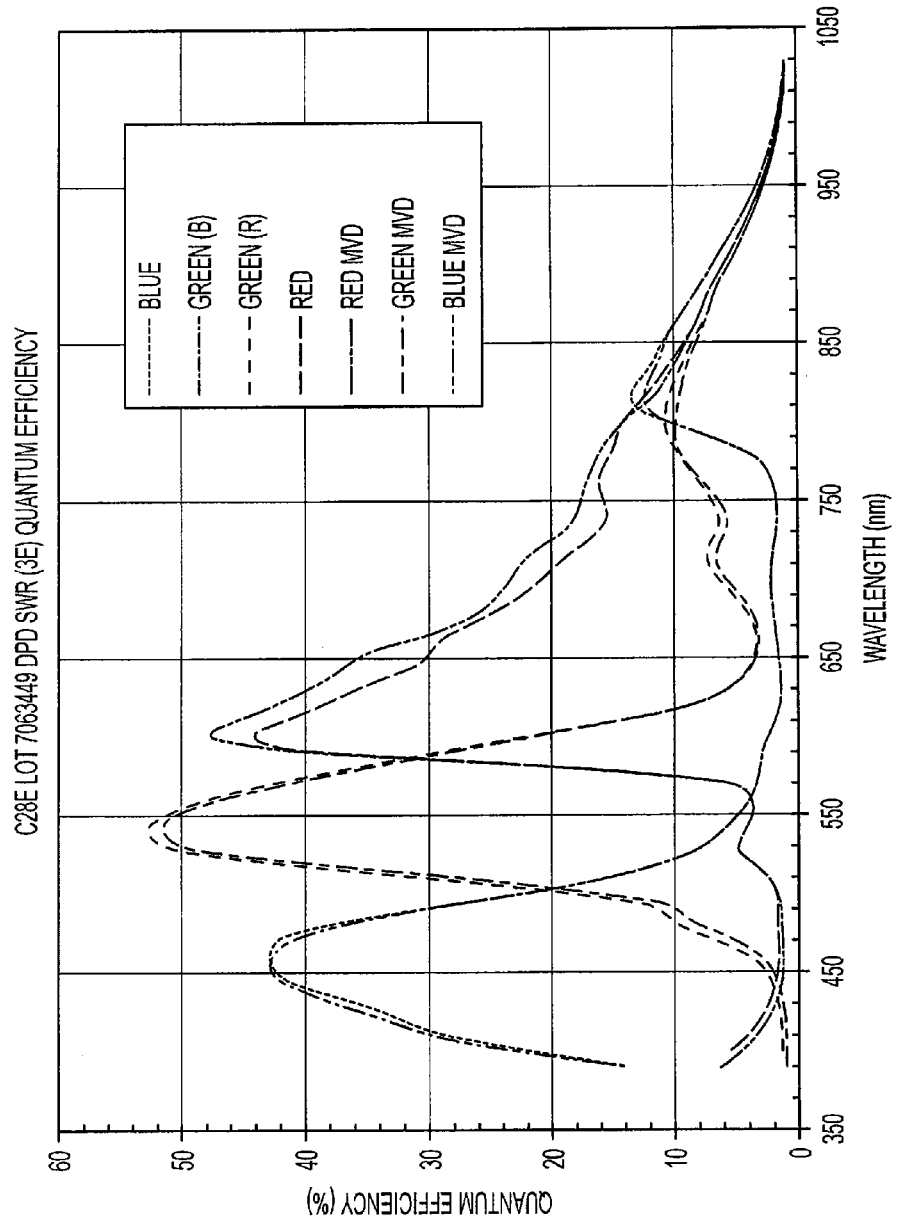
FIG. 6 is a graph of quantum efficiency versus wavelength showing reduced crosstalk between pixels according to another embodiment of the invention.

As shown in FIG. 6, according to another example embodiment of the invention, the QE peak and QE width toward longer wavelength of the red filters may be increased consistently and significantly with silylating agent deposited by CVD due to less cross contamination from the green photoresist material. The cross-talk, for example, may be reduced by 1%. The green QE peak is lower with silylating agent deposited by CVD is because of thicker green filters. With adjustment of thickness, the green QE peak may be recovered.

Figure 7A:
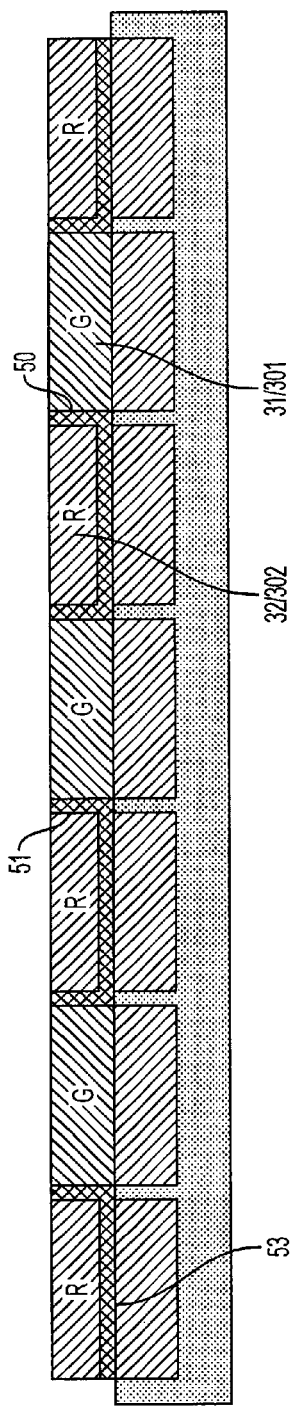
FIGS. 7A and 7B are sectional views of other alternative embodiments of the color filter array.
Figure 7B:
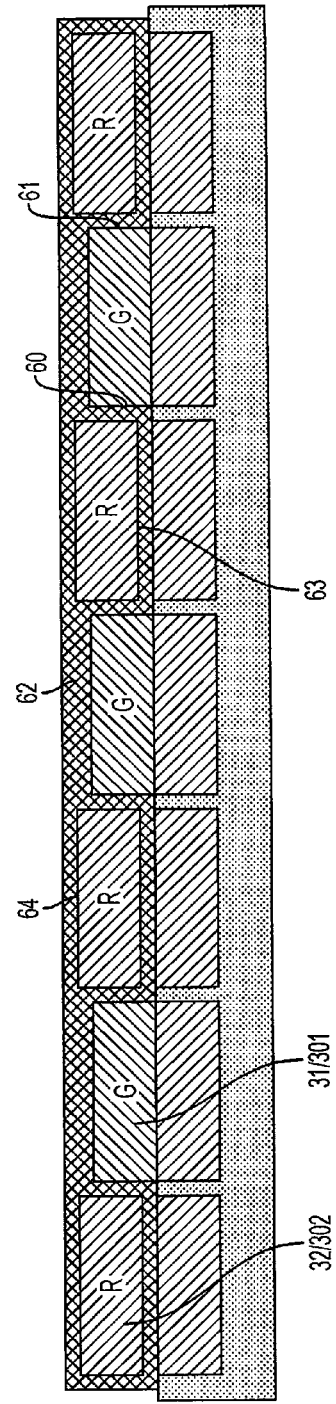
Figure 8C:
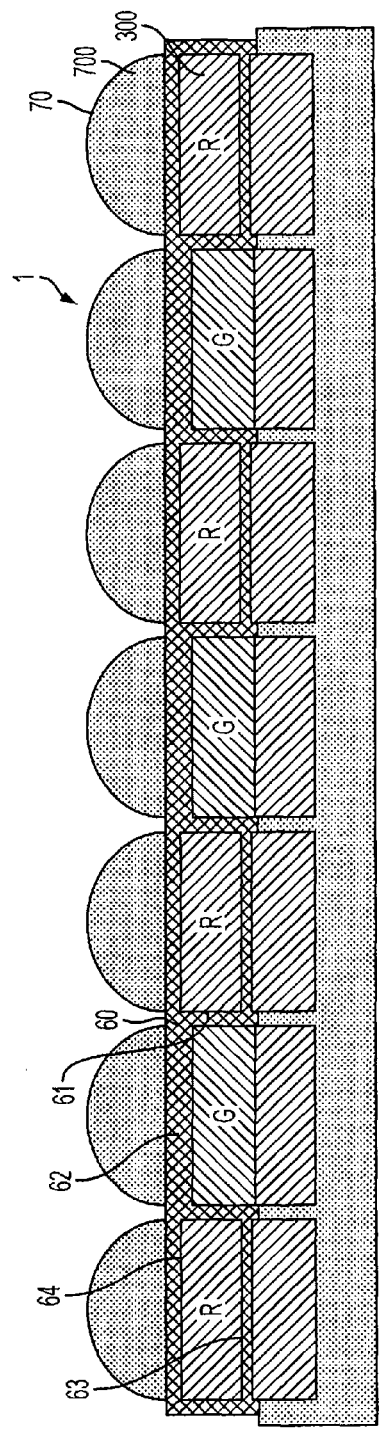
Figure 9A:
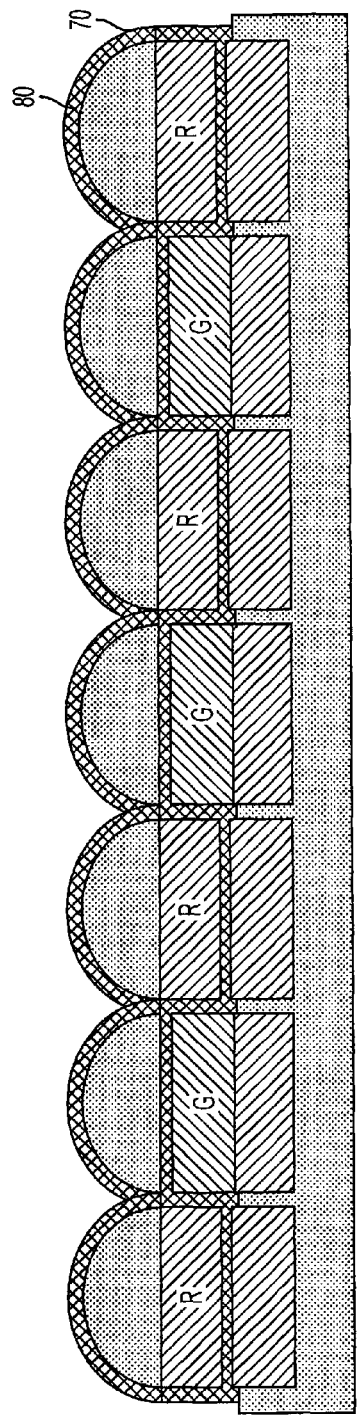
FIGS. 9A, 9B and 9C are sectional views of the silylating agent formed on a microlens array disposed on different embodiments of the color filter array in the electronic imager according to the invention.
Figure 9B:
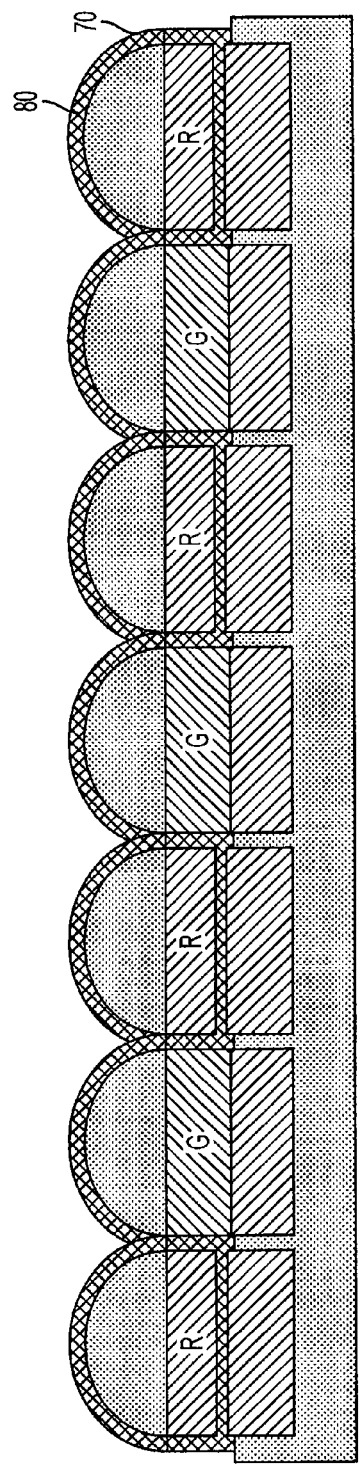

Regarding the formation of the silylating agent 40 on the color filter array 1, two other alternative embodiments are shown in FIGS. 7A and 7B. In the embodiment shown in FIG. 7A, the silylating agent 50 includes a side portion 51 formed on vertical sides of the elements 301 of the first color pattern 31 and a bottom portion 53 formed on the top side of the pixel elements 202 between the respective elements 301 of the first color pattern 31. In this embodiment, the silylating agent is not formed on the top of the first color pattern 31. This structure may be formed, for example by planarization the surface after depositing the red and blue filters to remove the silylating agent from the top of the green filter. Example thicknesses of the green, red and blue filters are from 500 nm to 1 um. The thicknesses of the green, red and blue filters can be anything in between 500 nm and 1 um and do not have to be same for each color, as shown in FIGS. 7A, 8B and 9B.

In another embodiment shown in FIG. 7B, the silylating agent 60 includes a side portion 61 formed on vertical sides of the elements 301 of the first color pattern 31, a first top portion 62 formed on the top side of each individual elements 301 of the first color pattern 31, a bottom portion 63 formed on the top side of the pixel elements 202 between the respective elements 301 of the first color pattern 31 and a second top portion 64 formed on the top side of each individual elements 302 of the second color pattern 32 and each individual element 303 of the third color pattern 33 (not shown in FIG. 7B). In this embodiment, the silylating agent 60 is additionally formed on the top of the elements 302 of the second color pattern 32 and on the top of the elements 303 of the third color pattern 33.

In addition to the application of the color filter array 1 in the electronic imager, a microlens array 70 may be disposed on the color filter array 1. Referring to FIGS. 8A to 8C, the microlens array 70 includes a plurality of microlenses 700 disposed on the color filter array 1. In one embodiment, shown in FIG. 8A, each individual microlens 700 is disposed on each individual color element 300. The silylating agent 40 includes the side portion 41, the top portion 42 and the bottom portion 43. In another embodiment, shown in FIG. 8B, each individual microlens 700 is disposed on each individual color element 300, and the silylating agent 50 includes the side portion 51 and the bottom portion 53. In another embodiment, shown in FIG. 8C, each individual microlens 700 is disposed on each individual color element 300, and the silylating agent 60 includes the side portion 61, the first top portion 62, the bottom portion 63 and the second top portion 64.

Figure 9C:
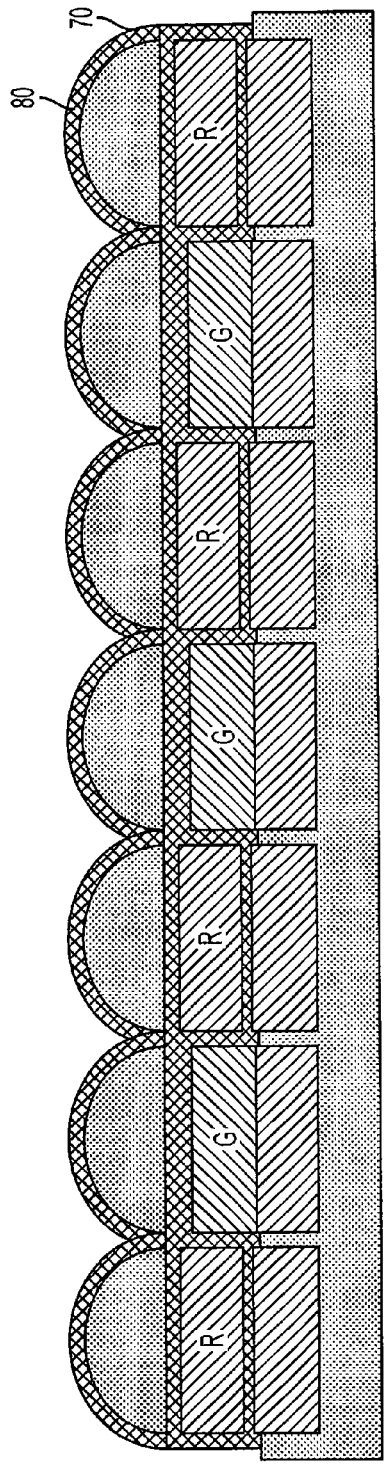

The chemical modification using the silylating agent may also be applied to the microlens array 70 to form a microlens array that is harder and has a lower refractive index. Referring to FIGS. 9A to 9C, the silylating agent 80 is formed on the microlens array 70 by means of vapor deposition, for example in an CVD chamber, or solution deposition. FIG. 9A shows the microlens array 70 with the silylating agent 80 disposed on the embodiment of the color filter array 1, shown in FIG. 2. FIG. 9B shows the microlens array 70 with the silylating agent 80 disposed on another embodiment of the color filter array 1, shown in FIG. 7A. FIG. 9C shows the microlens array 70 with the silylating agent 80 disposed on yet another embodiment of the color filter array 1, shown in FIG. 7B.

In the embodiments described above, the silylating agent may be further hydrolyzed or oxidized, either during the deposition, or prior to the application of the silylating agent, forming a siloxane.

Furthermore, in the embodiments described above, the silylating agent may be formed in a very thin layer on individual color filters, on one or more color filter patterns, on microlenses, and on pixel sensors having many different sizes and shapes. The example silylating agents react with the photoresist materials and generates a cross-linking of the photoresist materials so as to create a boundary protective layer to prevent the color filters from reacting with each other. With the chemical modification of the color filter array 1, the color filter interaction in the color filter array 1 is limited. The silylating agent deposited on the surface of the color filters or the color filter patterns or the pixels has a thickness in the range of 1 nanometer to 1000 nanometer. In example embodiments, the silylating agent deposited on the surface of the color filters or the color filter patterns or the pixels has a thickness in the range of 5 nanometer to 20 nanometer.

Referring to FIGS. 10A to 10E, a method of forming the color filter array 1 is described below.

Figure 10A:
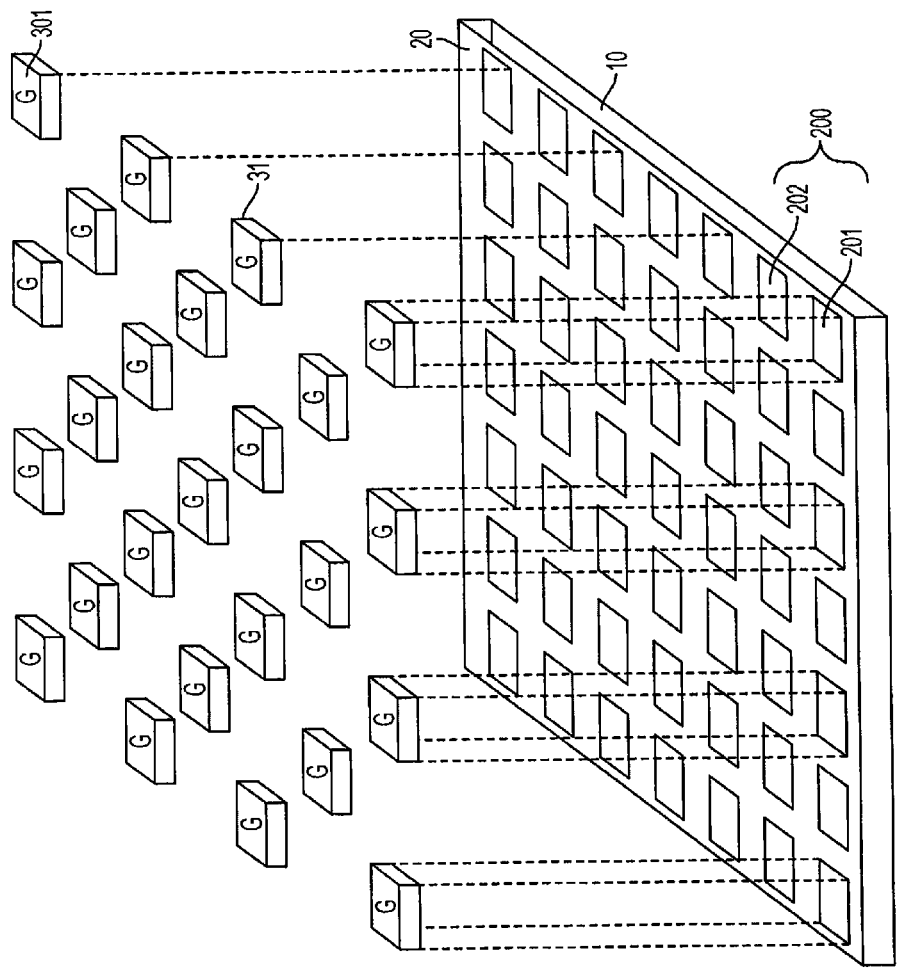
FIGS. 10A, 10B, 10C, 10D and 10E are perspective views illustrating a method of manufacturing the color filter array in the electronic imager according to the invention.
Figure 10B:
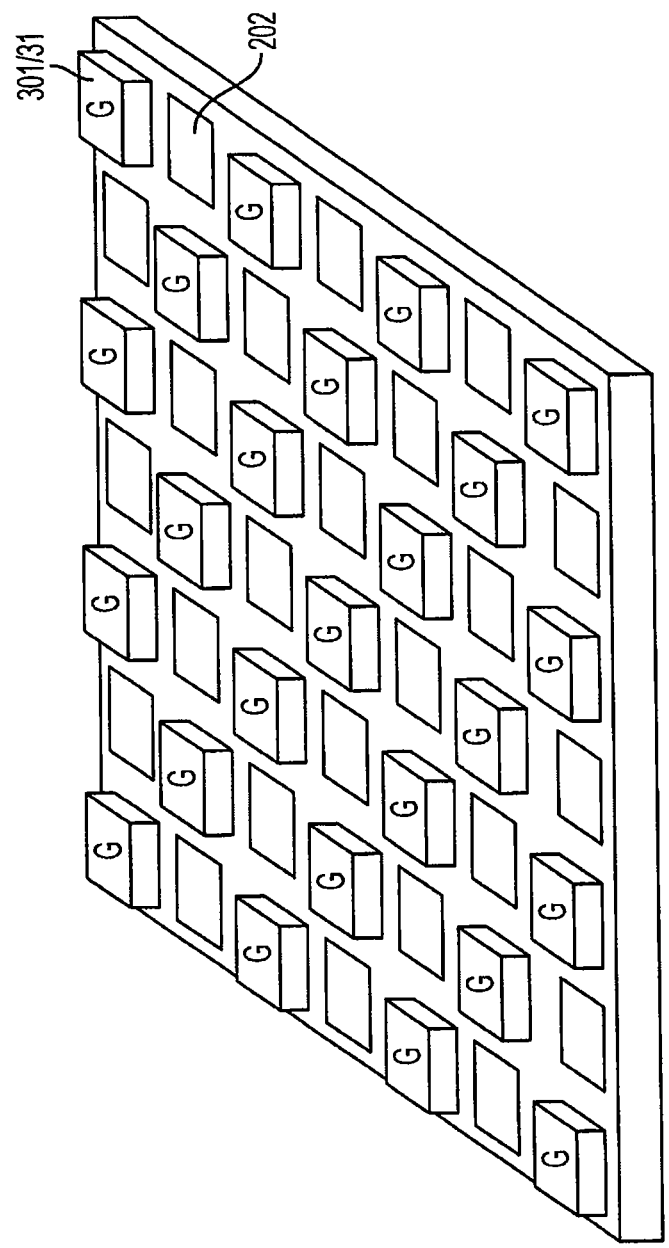

As shown in FIG. 10A, the pixel array 20 may be formed in the substrate 10 such that each pixel element 200 is embedded in the substrate 10. The first color pattern 31 containing green pigment is disposed on the pixel array 20. According to the Bayer pattern of RGBG, the elements 301 of the first color pattern 31 are alternately disposed on respective pixel elements 201, as shown in FIG. 10B.

Figure 10C:
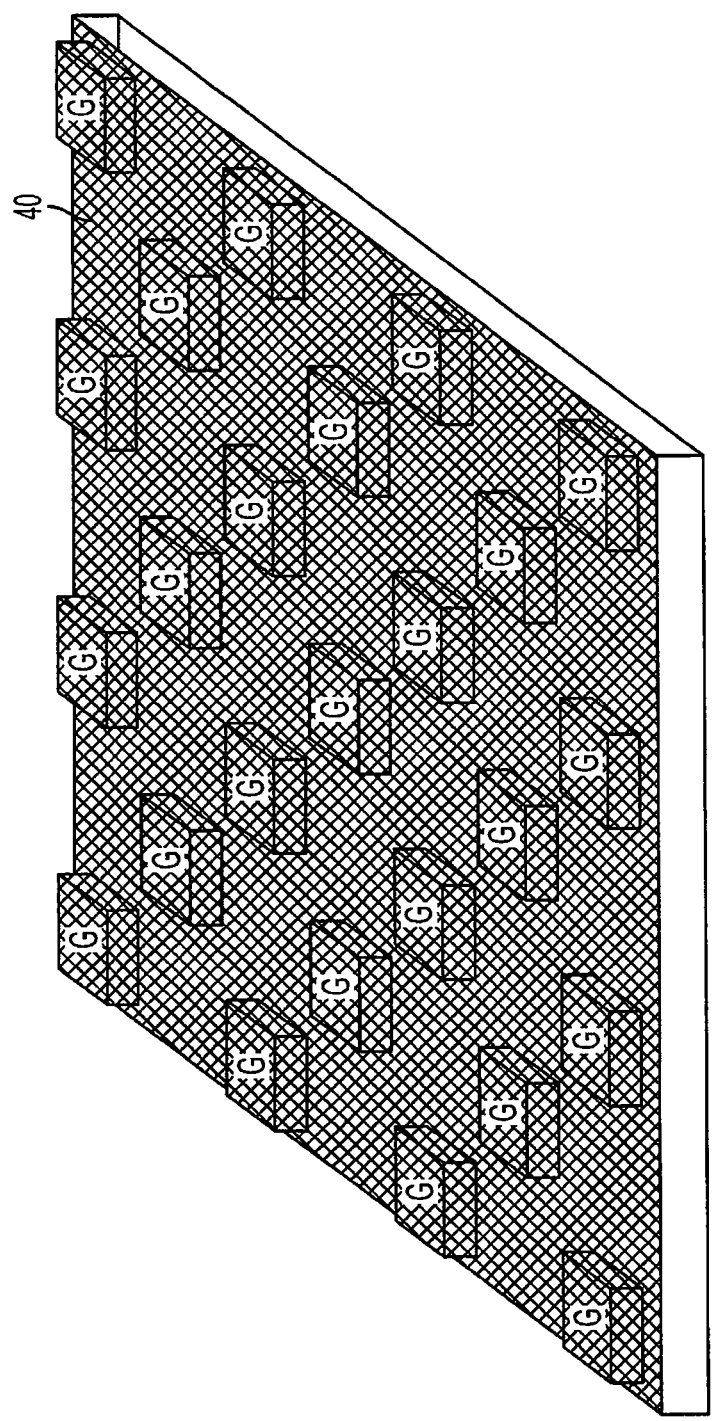

Next, the silylating agent 40 is deposited on the first color filter pattern 31 after disposing the first color filter pattern 31 on the pixel sensor array 20, as shown in FIG. 10C. The silylating agent 40 may be deposited on the first color pattern 31 by means of vapor deposition, for example CVD in a CVD chamber, or by solution deposition including spin-coating or dip-coating in a chemical bath.

Figure 10D:
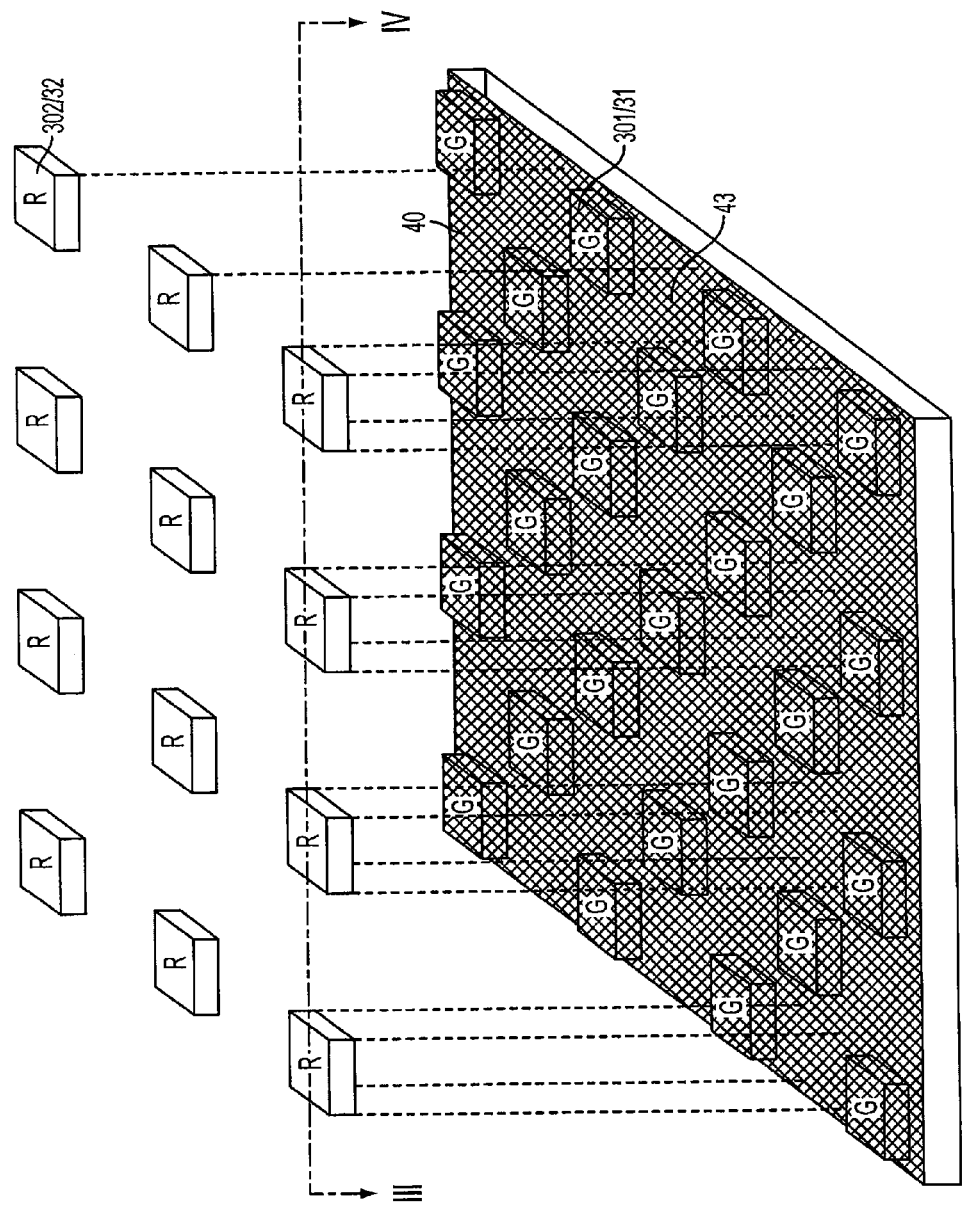
Figure 10E:
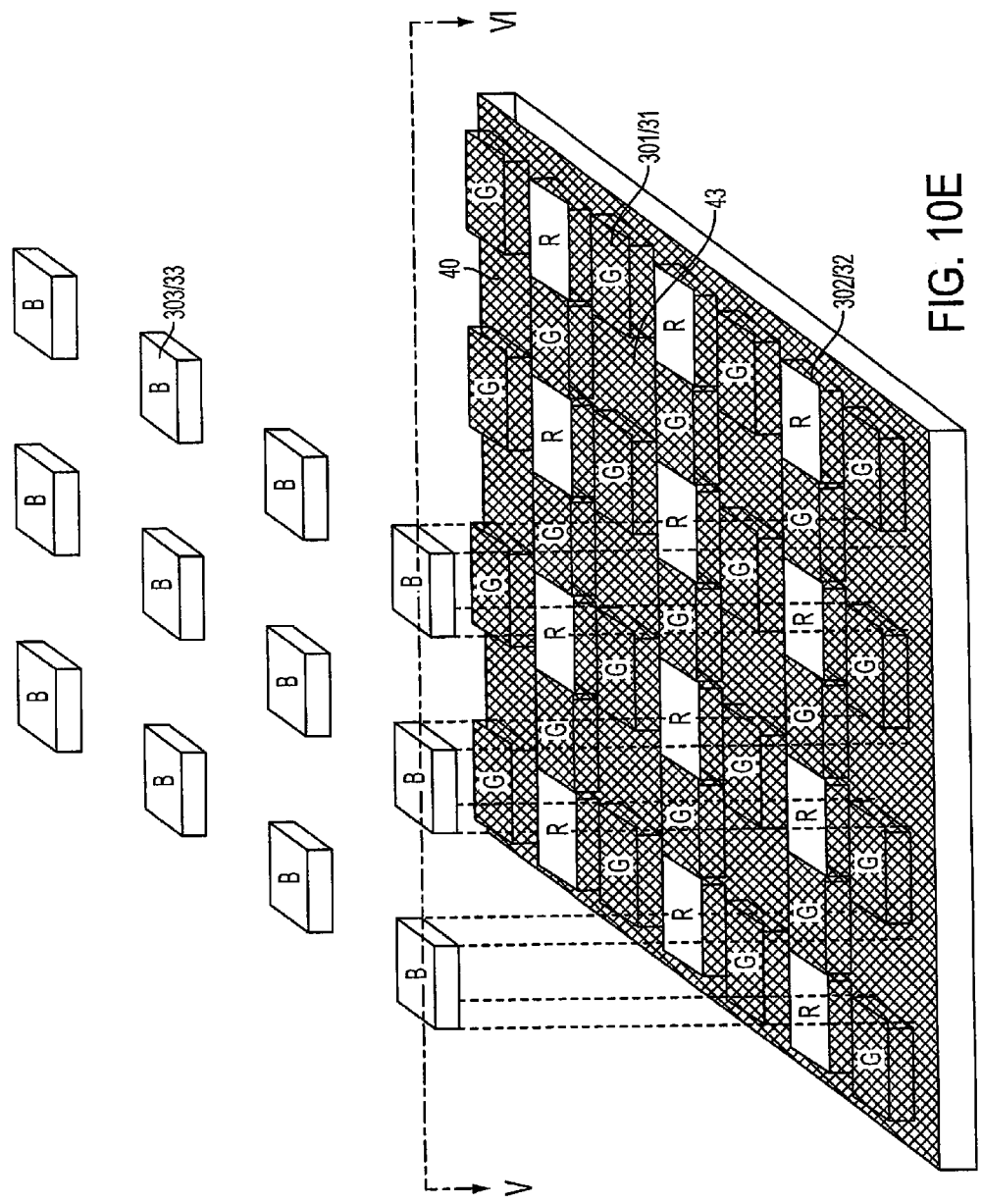
Figure 11:
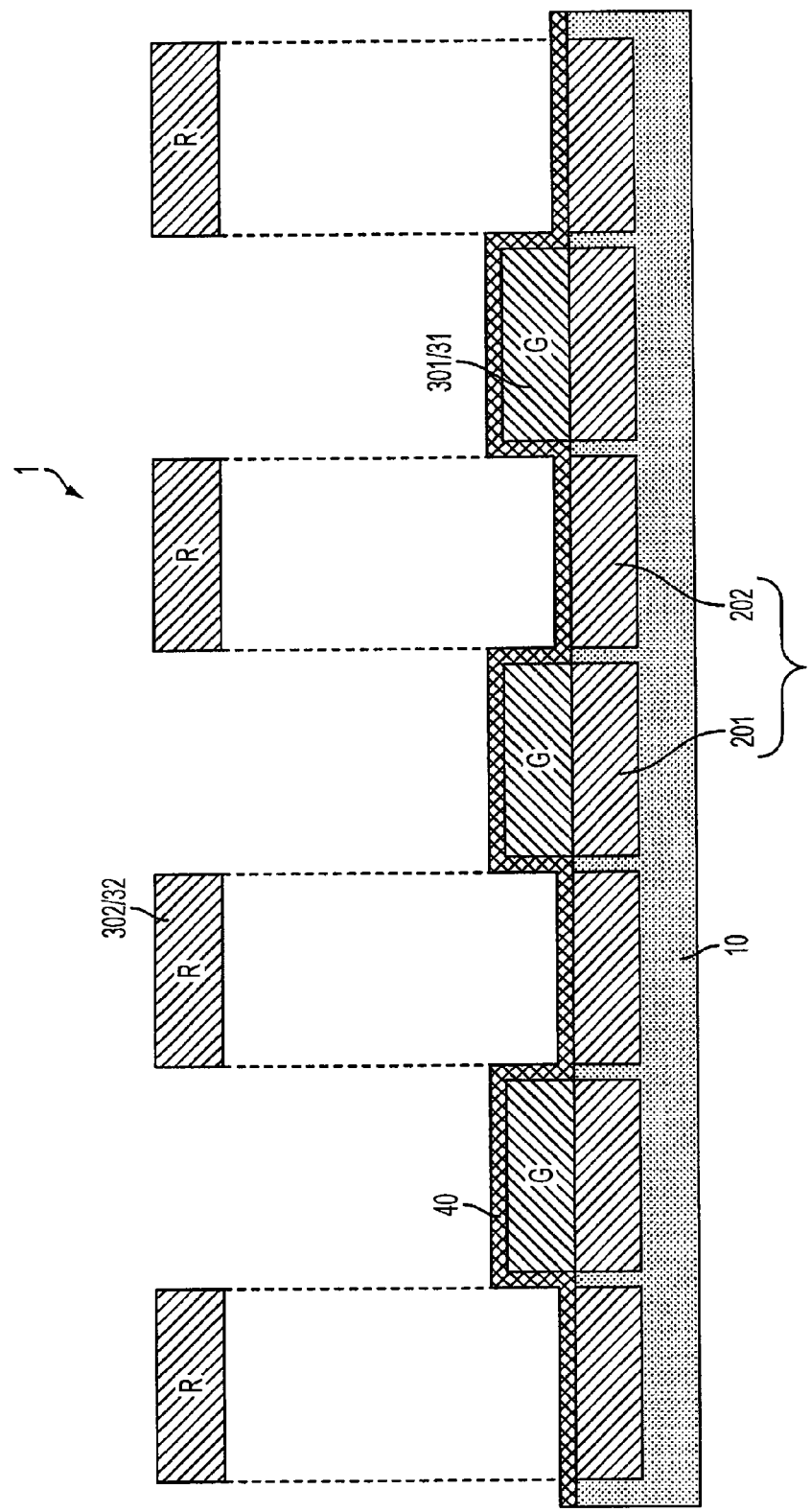
FIG. 11 is a sectional view illustrating the method of manufacturing the color filter array in the electronic imager according to the invention taken along the line III-IV in FIG. 10D, wherein a silylating agent is formed on a first color pattern of the color filter array.
Figure 12:
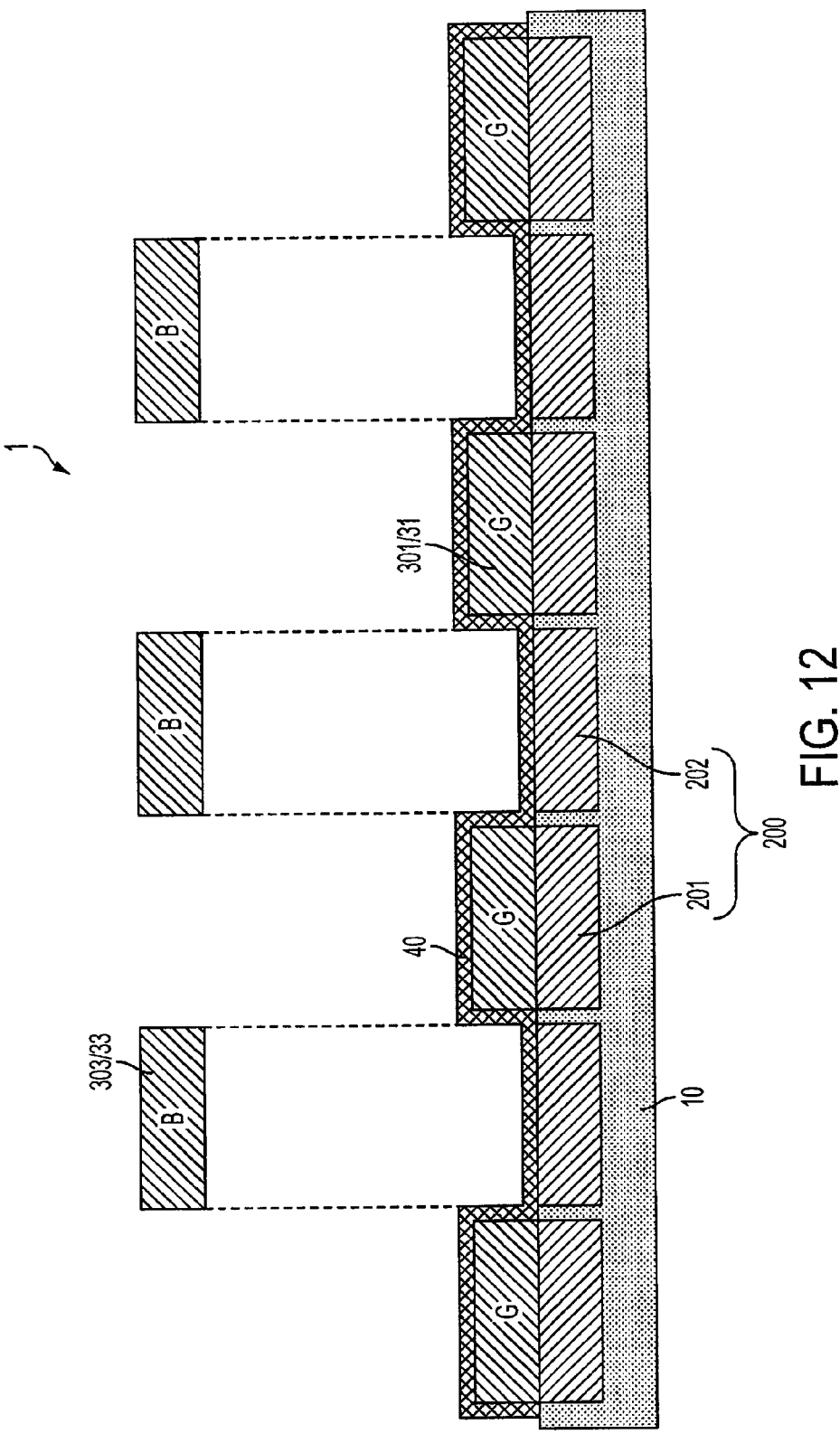
FIG. 12 is a sectional view illustrating the method of manufacturing the color filter array in the electronic imager according to the invention taken along the line V-VI in FIG. 10E, wherein a silylating agent is formed on a first color pattern of the color filter array.

Furthermore, as shown in FIG. 10D, the elements 302 of the second color filter pattern 32 containing red pigment are disposed on the bottom portion 43 of the silylating agent 40 between respective elements 301 of the first color filter pattern 31 with respect to their corresponding locations in the Bayer pattern of RGRG. FIG. 11 shows a sectional view of the disposals of the second color filter pattern 32 on the first color filter pattern 31, wherein the silylating agent 40 is formed on the first color pattern 31 of the color filter array 1. As shown in FIG. 10E, the elements 303 of the third color filter pattern 33 are disposed on the bottom portion 43 of the silylating agent 40 between respective elements 301 of the first color filter pattern 31 with respect to their corresponding locations in the Bayer pattern of BGBG. FIG. 12 shows a sectional view of the disposals of the third color filter pattern 33 on the first color filter pattern 31, wherein the silylating agent 40 is formed on the first color pattern 31 of the color filter array 1.

In an alternative embodiment of the color filter pattern 1 shown in FIG. 7A, before or after disposing the elements 302 and the elements 303 on the bottom portion 43 of the silylating agent 40, the top portion 42 of the silylating agent 40 may be removed.

In another alternative embodiment of the color filter pattern 1 shown in FIG. 7B, after disposing the elements 302 and the element 303 on the bottom portion 63 of the silylating agent 60, another layer of the silylating agent 60 may be deposited on the color filter array 1, for example, by means of chemical vapor deposition (CVD) in a chamber or solution deposition including spin-coating or dip-coating in a chemical bath. In this embodiment, in addition to the first top portion 62 of the silylating agent 60 formed on the top of the elements 301 of the first color pattern 31, the second top portion 64 of the silylating agent 60 may be formed on the elements 302 of the second color pattern 32 and the elements 303 of the third color pattern 33 (not shown in FIG. 7B).

Alternatively, embodiments of the invention may be used with color filter arrays having non-Bayer patterns. Those non-Bayer patterns include alternative color filter array to the Bayer pattern, and/or non-conventional patterns, colors and sequences for the color deposition. Examples of such non-Bayer patters include RGBE pattern (red, green, blue, emerald), CYGM pattern (cyan, yellow, green, magenta), CYYM filter (one cyan, two yellow, and one magenta), RGBW pattern (red, green, blue, white), CMYW pattern (cyan, magenta, yellow, and white), RGBW Bayer pattern (traditional RGBW similar to Bayer and RGBE patterns), and any other existing and prospective color filter patterns. Depending upon the color filter pattern applied in the embodiment, the elements of the first color pattern may be alternately disposed on respective pixel elements, as with the green pattern in the Bayer pattern of RGBG. Next, the silylating agent may be deposited on the first color filter pattern. Then, the elements of the second, third, fourth and other color filter patterns may be disposed on the bottom portion of the silylating agent between the respective elements of the first color filter pattern with respect to their corresponding positions in the color filter pattern applied in the embodiment.

An alternative embodiment of the color filter pattern applied in the embodiment may be, before or after disposing the elements of the second, third, fourth and other color filter patterns on the bottom portion of the silylating agent, removing the top portion of the silylating agent, as disclosed for the Bayer pattern of RGBG shown in FIG. 7A.

An another alternative embodiment of the color filter pattern applied in the embodiment may be, after disposing all elements of the color filter pattern applied on the bottom portion of the silylating agent, depositing another layer of the silylating agent on the color filter pattern. In this embodiment, all elements of the color filter pattern applied in the embodiment may have a top portion of the silylating agent, as disclosed for the Bayer pattern of RGBG shown in FIG. 7B.

After forming the color filter array 1, the microlens array 70 may be formed on the color filter array 1, as shown in FIG. 8A to 8C. FIG. 8A to 8C show the microlens array 70 disposed on the different embodiments of the color filter array 1 as described above referring to FIG. 2 and FIGS. 7A and 7B.

As shown in FIG. 9A to 9C, next, the silylating agent 80 may be deposited on the microlens array 70, for example, by means of chemical vapor deposition in a chamber or solution deposition including spin-coating or dip-coating in a chemical bath, corresponding to the different embodiments of the color filter array 1 shown in FIG. 8A to 8C.

Furthermore, in the embodiments described above, the silylating agent may be formed on individual color filters, on one or more color filter patterns with Bayer patterns or non-Bayer patterns or any other existing or prospective color filter patterns, on microlenses, and on pixel sensors having many different sizes and shapes.

In the embodiments described above, the silylating agent may be further hydrolyzed or oxidized, either during the deposition, or prior to the application of the silylating agent, forming a siloxane.

In summary, with the chemical modification of the silylating agent according to the invention for a color filter array 1 for an electronic imager, crystalline byproducts that may generated through the reaction of individual color filter materials causing defects at the surface of the color filter array and at the interfaces of the individual pixels can be reduced. Additionally, with the properties of the silylating agents, such as, chemical resistance, tunable refractive index, tunable mechanical properties, excellent photo-stability and good thermal stability, the outer layers of the photoresist material and the microlenses may be made harder and also to have a lower the refraction index to limit optical losses.

The imager sensor of the invention has a pixel sensor array formed on a substrate, a plurality elements of a color filter array containing respective pigments form multiple color filter patterns on the pixel sensor array. A silylating agent is formed between at least first and second ones of the multiple color filter patterns.

A method for forming the color filter array includes forming multiple color filter patterns in an electronic imager including a pixel sensor array on a substrate. The method comprises forming a first color filter pattern of the multiple color filter patterns on the pixel sensor array, depositing a silylating agent on the first color filter pattern and disposing elements of a second color filter pattern of the multiple color filter patterns on the silylating agent between respective elements of the first color filter pattern.

Although the invention is illustrated and described herein with references to specific embodiments, the invention is not intended to be limited to the details shown. Rather, various modifications may be made in the details within the scope and range of equivalents of the claims and without departing from the invention.

What is claimed:

1. A color electronic imager comprising:
a pixel sensor array formed on a substrate;
a plurality of elements of a color filter array (CFA) containing pigments forming multiple color filter patterns on the pixel sensor array; and
a silylating agent formed between respective elements of at least first and second ones of the multiple color filter patterns.

2. The color electronic imager of claim 1, wherein the multiple color filter patterns form a Bayer pattern.

3. The color electronic imager of claim 2, wherein a first color filter pattern of the multiple color filter patterns includes a green pigment and the silylating agent is formed on the first color filter pattern of the multiple color filter patterns.

4. The color electronic imager of claim 3, wherein a second color filter pattern of the multiple color filter patterns includes a red pigment formed on the silylating agent and a third color filter pattern of the multiple color filter patterns includes a blue pigment formed on the silylating agent.

5. The color electronic imager of claim 1, wherein the silylating agent includes one or more compounds selected from the group consisting of $Cl_3SiCH_2CH_2SiCl_3$, $SiR_x(OR')_{4-x}$, $SiR_x(OR')_{4-x}$, $Si_2O(OR)_6$, $SiCl_yR_{4-y}$, $Si_2OCl_yR_{4-y}$, $Si_3O_2Cl_yR_{8-y}$, and hexamethylcyclotrisilazane $C_6H_{21}N_3Si_3$ where R and R' are each independently substituted or unsubstituted hydrocarbyl groups and x and y are each independently 0, 1, 2, 3, or 4.

6. The color electronic imager of claim 5, wherein the substituted hydrocarbyl groups comprise one or more functional groups selected from the group consisting of halides, alkyl groups, halogenated alkyl groups, aryl groups, halogenated aryl groups, alkenyl groups, CN groups, RCN groups, OR groups, $O_2R$—$NH_zR_{2-z}$, additional $Si(OR)_x$ groups, organic groups having a (meth)acryloxy, acetoxy, mercapto, amino or cyano group, and acrylate groups, where x=1, 2, 3, or 4 and z=0, 1 or 2.

7. The color electronic imager of claim 5, wherein the silylating agent is further hydrolyzed or oxidized, either during the deposition, or prior to the application of the silylating agent.

8. The color electronic imager of claim 1, wherein the silylating agent formed between respective elements of the at least first and second ones of the multiple color filter patterns has a thickness in the range of 1 nanometer to 1000 nanometer.

9. The color electronic imager of claim 8, wherein the silylating agent formed between respective elements of the at least first and second ones of the multiple color filter patterns has a thickness in the range of 5 nanometer to 20 nanometer.

10. The color electronic imager of claim 1, wherein the color filter array includes pigmented photoresist material.

11. The color electronic imager of claim 4, wherein the silylating agent is applied on top of the second and the third color filter patterns.

12. The color electronic imager of claim 1, further comprising a microlens array disposed on the color filter array.

13. The color electronic imager of claim 12, wherein the silylating agent is formed on the microlens array.

* * * * *